(12) United States Patent
Yamada

(10) Patent No.: US 6,927,491 B1
(45) Date of Patent: *Aug. 9, 2005

(54) BACK ELECTRODE TYPE ELECTRONIC PART AND ELECTRONIC ASSEMBLY WITH THE SAME MOUNTED ON PRINTED CIRCUIT BOARD

(75) Inventor: Yasuyoshi Yamada, Saitama (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 17 days.

(21) Appl. No.: 09/435,448

(22) Filed: Nov. 22, 1999

(30) Foreign Application Priority Data

Dec. 4, 1998 (JP) .......................................... 10-346025

(51) Int. Cl.⁷ .......................... H01L 23/48; H01L 23/52; H01L 29/40
(52) U.S. Cl. ....................... 257/737; 257/738; 257/773; 257/786
(58) Field of Search ................................ 438/613–617; 257/737, 738, 773, 786; 228/180.22

(56) References Cited

U.S. PATENT DOCUMENTS

| | | | | |
|---|---|---|---|---|
| 4,369,458 A | * | 1/1983 | Thomas et al. | 257/226 |
| 5,011,066 A | * | 4/1991 | Thompson | 228/180.21 |
| 5,214,308 A | * | 5/1993 | Nishiguchi et al. | 228/180.22 |
| 5,381,307 A | * | 1/1995 | Hertz et al. | 228/179.1 |
| 5,436,412 A | * | 7/1995 | Ahmad et al. | 174/257 |
| 5,675,179 A | * | 10/1997 | Shu et al. | 257/668 |
| 5,796,169 A | * | 8/1998 | Dockerty et al. | 257/738 |
| 5,801,447 A | * | 9/1998 | Hirano et al. | 257/778 |
| 5,811,351 A | * | 9/1998 | Kawakita et al. | 438/17 |
| 5,814,891 A | * | 9/1998 | Hirano | 257/691 |
| 5,828,128 A | * | 10/1998 | Higashiguchi et al. | |
| 5,872,051 A | * | 2/1999 | Fallon et al. | 438/616 |
| 5,883,435 A | * | 3/1999 | Geffken et al. | 257/734 |
| 5,886,409 A | * | 3/1999 | Ishino et al. | 257/737 |
| 5,892,289 A | * | 4/1999 | Tokuno | 257/778 |
| 6,018,462 A | * | 1/2000 | Sakuyama | 257/738 |
| 6,053,394 A | * | 4/2000 | Dockerty et al. | 228/180.22 |
| 6,093,630 A | * | 7/2000 | Geffken et al. | |
| 6,107,685 A | * | 8/2000 | Nishiyama | 257/737 |
| 6,142,609 A | * | 11/2000 | Aoki | 347/50 |
| 6,165,885 A | * | 12/2000 | Gaynes et al. | 438/612 |
| 6,175,114 B1 | * | 1/2001 | Hori | 250/332 |
| 6,232,564 B1 | * | 5/2001 | Arndt et al. | 174/266 |
| 6,271,583 B1 | * | 8/2001 | Sakoda et al. | |
| 6,346,679 B1 | * | 2/2002 | Nakamura | 174/260 |
| 6,395,991 B1 | * | 5/2002 | Dockerty et al. | 174/252 |

FOREIGN PATENT DOCUMENTS

| | | | | | |
|---|---|---|---|---|---|
| JP | 04148537 A | * | 5/1992 | ........... | H01L/21/60 |
| JP | 4-314355 | | 11/1992 | | |
| JP | 3012948 | | 4/1995 | | |
| JP | 7-321247 | | 12/1995 | | |
| JP | 9-307022 | | 11/1997 | | |
| JP | 9-330993 | | 12/1997 | | |
| JP | 10-56093 | | 2/1998 | | |
| JP | 10303249 A | * | 11/1998 | ........... | H01L/21/60 |
| JP | H11-74637 | | 3/1999 | | |

* cited by examiner

*Primary Examiner*—David E. Graybill
(74) *Attorney, Agent, or Firm*—Sughrue Mion, PLLC

(57) ABSTRACT

A back electrode type electronic part includes a main body including a circuit, and electrodes arranged for solder bumps on a back surface portion of the electronic part and connected to the circuit. Each of groups of the electrodes in portions of the electrode arrangement is provided for a single first solder bump which is larger than second solder bumps for the electrodes arranged other than the corner portions. Also, the group of electrodes includes electrodes having a substantially same potential level when the circuit operates.

35 Claims, 4 Drawing Sheets

BACK ELECTRODE TYPE ELECTRONIC PART AND ELECTRONIC ASSEMBLY WITH THE SAME MOUNTED ON PRINTED CIRCUIT BOARD

BACKGROUND OF THE INVENTION

1. Field of the Invention

The present invention relates to a back electrode type electronic part and an electronic assembly with the same mounted on a printed circuit board.

2. Description of the Related Art

With appearance of a small size electronic appliance such as a portable information terminal, a back electrode type or a Ball Grid Array (BGA) type electronic part used in such an electronic appliance is made small in size. Also, a BGA electrode is made small. Therefore, a soldering connection section between the BGA type electronic part and a printed circuit board in the electronic appliance is made small so that the endurance to heat cycle stress and external stress is decreased.

FIG. 1 shows a cross sectional view of an electronic assembly with a printed circuit board on which a conventional BGA type electronic part is mounted. Referring to FIG. 1, solder balls 13 are provided between electrode lands 12 of the electronic part 11 and electrode lands 16 of the printed circuit board 15. Especially, the solder balls on the corners are shown by a reference numerals 14.

In Japanese Laid Open Patent Application (JP-A-Heisei 10-56093), a semiconductor device and an electric appliance in which the semiconductor device is incorporated are described. In this reference, a dummy electrode is provided in a corner section of a BGA electrode arrangement while one substrate electrode corresponds to one part electrode. Thus, even if a crack is generated in a solder connection section of the dummy electrode due to heat cycles, solder connection of a signal electrode is guaranteed.
and even if A heat cycle stress is applied to the printed circuit board on which the BGA type electronic part is mounted, due to environment temperature change and change of the heating of BGA type electronic part itself. At this time, any warp is caused for the difference in thermal expansion percentage between the BGA type electronic part and the printed circuit board. This warp often centers on the solder connection sections in 4 peripheral corner sections of electrode arrangement of the BGA type electronic part. When the solder connection section is not endured for this warp, there is the high possibility that the crack is generated in the solder connection section.

Also, when an external stress is applied to the printed circuit board on which the BGA type electronic part is mounted, to bend the board, the 4 corner sections of the electrode arrangement of the BGA type electronic part are easiest to receive stress transformation most. This is because there are few neighbor electrodes by which the stress can be dispersed and the transformation of the printed circuit board due to the external stress becomes the largest. The destruction of the solder connection section through the stress transformation often progresses from the 4 corner sections toward the inside of the electrode arrangement.

In conjunction with the above description, a chip carrier is disclosed in Japanese Laid Open Patent Disclosure (JP-A-Heisei 4-314355). In this reference, positioning pads are provided on a back surface of a chip carrier to have a larger area than connection pads. A conductive circuit is provided on a substrate to have a larger area than a connection conductive circuit corresponding to the connection pad. The chip carrier is preliminarily soldered and the chip carrier is positioned on the substrate. Then, reflow is carried out. Thus, the positioning is carried out by use of solder balls for the positioning pads and then the connection pads are connected to the substrate.

Also, a semiconductor device is disclosed in Japanese Laid Open Patent Disclosure (JP-A-Heisei 9-330993). In this reference, a solder bump forming land 3 is separately formed as lands 3a and 3b in a BGA structure. After the semiconductor chip 1 is molded, a test is carried out by use of the lands 3a and 3b. Thereafter, when a solder bump is formed, lands 3a and 3b are electrically connected by a single solder bump.

Also, a BGA semiconductor device is disclosed in Japanese Laid Open Patent Disclosure (JP-A-Heisei 7-321247). In this reference, a pad 14 is formed to have a shape in which a length in a direction of a line passing through a transformation center 12 is larger than that in a direction orthogonal to the line. Thus, a contact angle in a direction of generation of thermal warp is made larger than a conventional device so that a solder life to the thermal warp is elongated.

Also, a surface mounting type semiconductor package is disclosed in Japanese Laid Open Patent Disclosure (JP-A-Heisei 9-307022). In this reference, a semiconductor package 3 has a rectangular package body 15. Solder balls 22 which are covered by a solder layer 23 are arranged in a matrix on a back surface 16b of the package body. The solder balls are soldered to pads 8 of a printed circuit board 2 by reflow. The solder balls 22a in the outermost of an arrangement area of the solder balls have a larger diameter than the other solder balls.

In addition, a BGA electronic part is disclosed in Japanese Registered Utility Model No. 3012948. In this reference, dummy terminals 8 are provided in a region of soldering sections where any crack is easy to be generated due to heat cycles. The dummy terminals are arranged in an outermost portion or corner portions of the terminal arrangement.

SUMMARY OF THE INVENTION

Therefore, an object of the present invention is a back electrode type electronic part in which strength of the solder connection sections at the 4 corner sections of the electrode arrangement is increased for improvement of the mount reliability.

Another object of the present invention is to provide an electronic assembly in which such a back electrode type electronic part is mounted on a printed circuit board by which the reliability of the assembly is increased.

In order to achieve an aspect of the present invention, a back electrode type electronic part includes a main body including a circuit, and electrodes arranged for solder bumps on a back surface portion of the electronic part and connected to the circuit. Each of groups of the electrodes in portions of the electrode arrangement is provided for a single first solder bump which is larger than second solder bumps for the electrodes arranged other than the corner portions. Also, the group of electrodes includes electrodes having a substantially same potential level when the circuit operates.

The electrodes may be arranged in a matrix, and the corner portions may be 4 corner portions.

Also, the group of electrodes may include a non-contact electrode which is not connected to the circuit.

Also, one of the electrodes of the group may be a signal electrode, a ground potential electrode, or a power supply potential electrode.

In order to another aspect of the present invention, an electronic assembly includes a back electrode type electronic part, a printed circuit board and solder bumps. The back electrode type electronic part includes electrodes provided on a back surface portion of the electronic part and connected to the circuit. Groups of the electrodes at corner portions of the electrode arrangement is groups of integrated electrodes, and the group of integrated electrodes includes the electrodes having a substantially same potential level when the circuit operates. The printed circuit board has substrate electrodes corresponding to the electrodes provided for the electronic part. One of the substrate electrodes as a first substrate electrode is provided for each of the groups of integrated electrodes, and the substrate electrodes as second substrate electrodes other than the first substrate electrodes are provided for the electrodes of the electronic part other than the integrated electrodes. Solder bumps including first solder bumps connected with the groups of integrated electrodes and the first substrate electrodes and second solder bumps connected with the second substrate electrodes and the electrodes of the electronic part other than the integrated electrodes.

Also, the electrodes of the electronic part may be arranged in a matrix, and the portions are 4 corner portions.

Also, one of the integrated electrodes of the group may be a non-contact electrode which is not connected to the circuit, a signal electrode or a power supply potential electrode.

DESCRIPTION OF THE PREFERRED EMBODIMENTS

Figure 2:
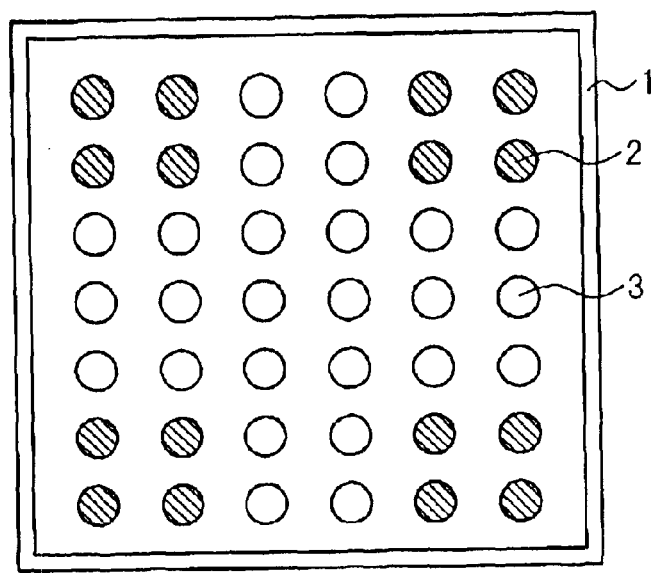
FIG. 2 is a back plan view showing the electrode arrangement of a BGA type electronic part according to a fist embodiment of the present invention.

Hereinafter, a back electrode type electronic part and an assembly in which the back electrode type electronic part is mounted on a printed circuit board will be described FIG. 2 is a back plan view showing a back electrode type or BGA type electronic part according to the first embodiment of the present invention. A reference numeral 1 in FIG. 2 denotes the BGA type electronic part, 2 denotes integration possible specific electrodes, and 3 denotes a general electrodes. The electronic part includes a circuit (not shown) therein and the specific electrodes 2 and the general electrodes 3 are connected to the circuit. In the first embodiment, a set of four ground potential electrodes as the specific electrodes 2 are provided at each of four corner sections of the BGA type electronic part 1. As seen from FIG. 2, the electrodes are arranged in a matrix with a constant distance between adjacent ones in a row direction or a column direction. However, a pitch between the specific electrodes may be shorter than a pitch between the general electrodes. Also, in FIG. 3, all the electrodes have the same size. However, the specific electrode may be have a different from the general electrode in size. For example, the specific electrode may be larger or smaller than the general electrode.

Although ground potential electrodes are used as the specific electrodes, other electrode may be used as the specific electrodes. For example, the following electrodes shown by ① to ⑦ may be used as a set of integration possible electrodes. That is, ① the ground potential electrodes are gathered or are provided newly for a set;

② non-contact electrodes which are not connected to the circuit of the electronic part 1 are gathered or are provided newly for a set;

③ signal electrodes which having a same signal level when the circuit operates are gathered or are provided newly for a set;

④ power supply potential electrodes are gathered or are provided newly for a set;

⑤ ground potential electrodes and non-contact electrode electrodes are gathered for a set;

⑥ same signal electrodes and non-contact electrode electrodes are gathered for a set; and ⑦ power supply electrodes and non-contact power supply electrodes are gathered for a set.

Figure 3:
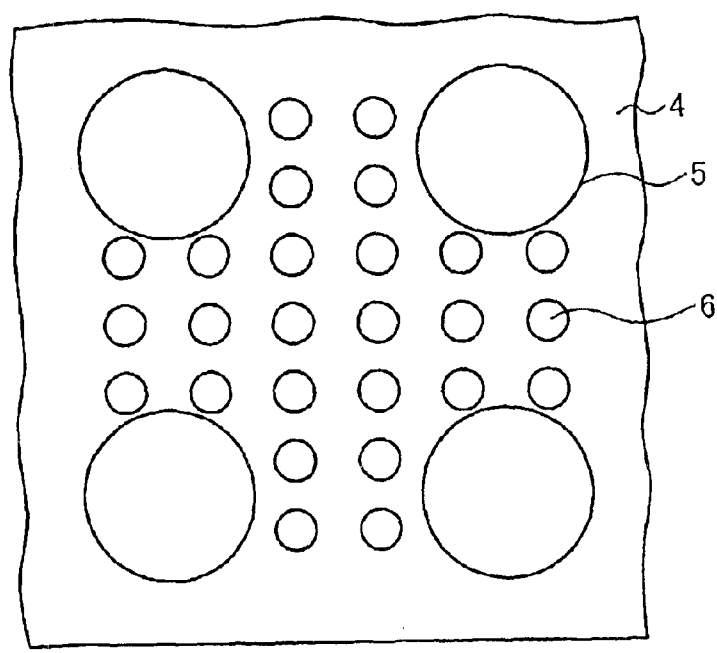
FIG. 3 is a partial plan view showing the electrode arrangement of a printed circuit board on which the BGA type electronic part of FIG. 2 is mounted.

FIG. 3 shows a printed circuit board on which the BGA type electronic part 1 shown in FIG. 2 is mounted. In FIG. 3, a reference numeral 4 denotes a substrate, 5 denotes an integration electrode and 6 denotes a general electrode. The substrate 4 in this embodiment has an integration electrode 5 for the specific electrodes 2 in the BGA type electronic part shown in FIG. 2 and a general electrode 6 for the general electrode 3. The integration electrodes are provided at the four corner sections and the four specific electrode are integrated into the same integration electrode 5. By this, the solder connection section is made large so that it is made possible to improve the connection strength between the soldered BGA type electronic part and the printed circuit board.

Figure 1:
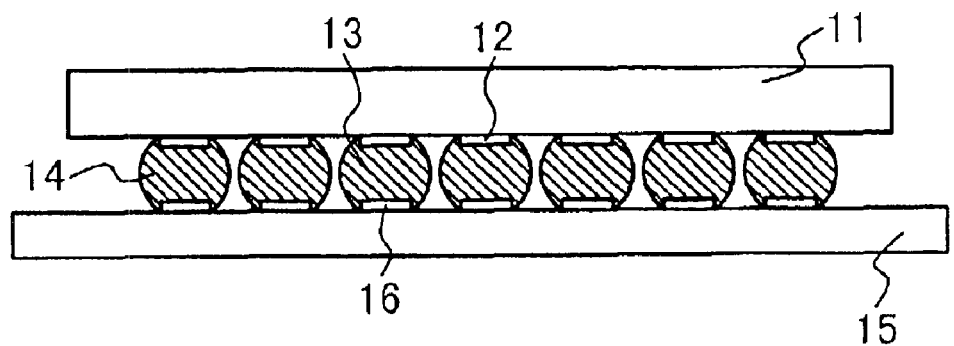
FIG. 1 is a cross sectional view showing the state in which a conventional BGA type electronic part is mounted on a printed circuit board.
Figure 4:
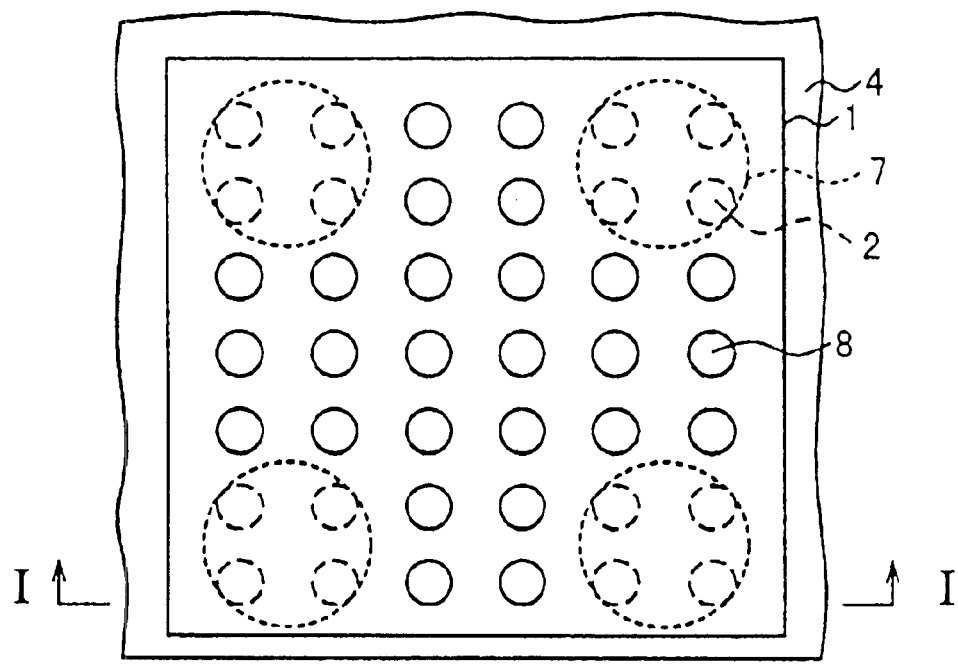
FIG. 4 is a plan view showing the state in which the BGA type electronic part of FIG. 2 is mounted on the printed circuit board of FIG. 3.
Figure 5:
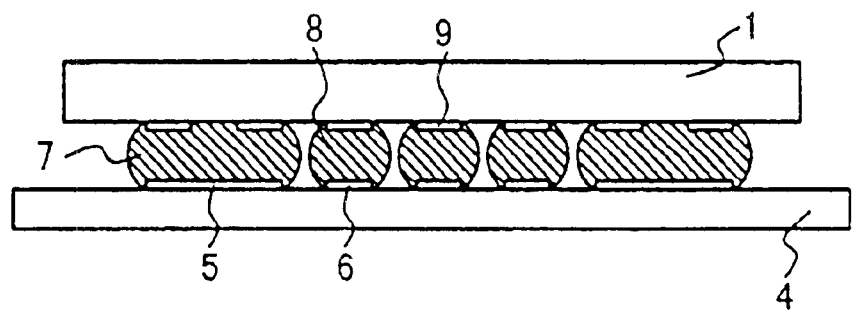
FIG. 5 is a cross sectional view along the line I—I of FIG. 4 when the BGA type electronic part of FIG. 2 is mounted on the printed circuit board of FIG. 3.

FIG. 4 shows the state in which the BGA type electronic part shown in FIG. 1 is soldered to the printed circuit board 4 shown in FIG. 3. The group of specific electrodes 2 of the BGA type electronic part 1 are soldered to the integration electrode 5 of the printed circuit board 4. At this time, as shown in FIG. 5, a solder bump for the specific electrodes 2 of the BGA type electronic part and the integration electrode 5 is large. The solder bump for the general electrode 3 of the BGA type electronic part and the general electrode 6 of the printed circuit board 4 is small.

That is, the large solder connection section between the specific electrodes 2 of the BGA type electronic part and the integration electrode 5 of the printed circuit board 4. As a result, the connection strength of the solder connection sections in the four corner sections is improves increasingly. Therefore, it becomes possible to prevent generation of any crack due to the above-mentioned heat cycle stress and destruction due to the external stress, resulting in improvement of the reliability of the mounted BGA type electronic part.

Figure 6:
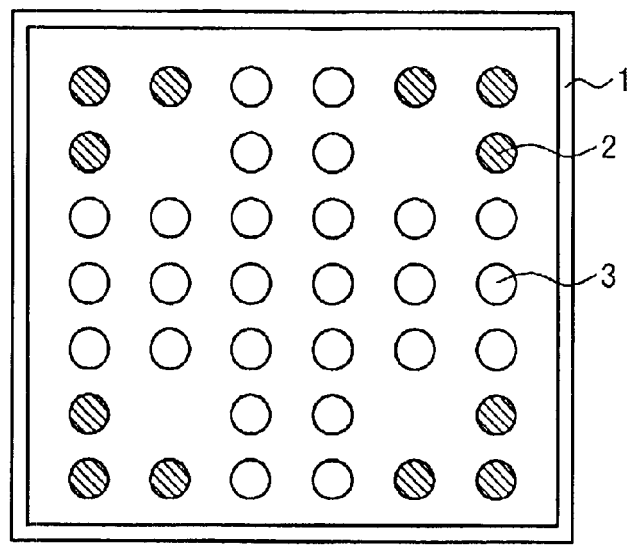
FIG. 6 is a plan view showing the electrode arrangement of the BGA type electronic part according to a second embodiment of the present invention.

In the present invention, the number of specific electrodes gathered at each of the four corner sections is not limited to 4 electrodes, and may be an optional number. For example, as shown in FIG. 6, three specific electrodes 3, namely, the specific electrode 2 situated in each of the four corner of the BGA type electronic part 1 and the two electrodes 2 arranged along the edge section of the BGA type electronic part 1 and located in the neighborhood to the above electrode 2 are set as the integration possible specific electrodes. Also, the number of integration electrodes is not limited to four. The number of integration electrodes may be an optional number.

Figure 7:
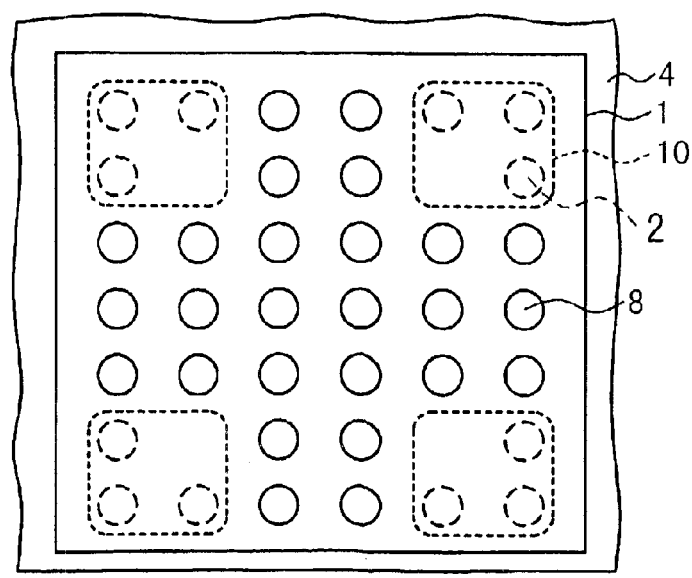
FIG. 7 is a plan view showing the state in which the BGA type electronic part of FIG. 6 is mounted on the printed circuit board.

Also, as shown in FIG. 7, a square integration electrode 10 is provided for the substrate 4 to mount the BGA type electronic part 1 shown in FIG. 6. This integration electrode 10 is connected with three specific electrodes 2 of the BGA type electronic part 1 shown in FIG. 6 with solder.

The integration electrode provided on the substrate 4 may be circular as shown in FIG. 3 and FIG. 4, rectangular as shown in FIG. 7, or optional shapes such as an ellipse and an oval shape.

According to the present invention, the group of specific electrodes is soldered to the integration electrode of the substrate while the general electrode of the BGA type electronic part is connected with the general electrode of the printed circuit board. The solder connection section of the specific electrodes of the BGA type electronic part is made large in each of the four corner sections. Therefore, the connection strength of the soldering section in the four corners is increased. Also, it is possible to prevent generation of the crack due to the above-mentioned heat cycle stress and the destruction due to the external stress, resulting in the improvement of the loaded reliability of the BGA type electronic part.

What is claimed is:

1. A back electrode electronic part comprising:
   a main body;
   a circuit; and
   electrodes arranged on an outer back surface of the main body; wherein:
   the electrodes comprise integration possible electrodes and general electrodes;
   a plurality of the integration possible electrodes are arranged adjacently to each other to form a group of integration possible electrodes;
   the group of integration possible electrodes is connected to a single first solder bump;
   each of the general electrodes are individually connected to single second solder bumps;
   the first solder bump is larger than each of the second solder bumps; and
   each of the integration possible electrodes that are part of the group of integration possible electrodes have a substantially same potential level when said circuit operates.

2. A back electrode electronic part according to claim 1, wherein said electrodes are arranged in a matrix, and said group of integration possible electrodes is arranged at a corner of the matrix.

3. A back electrode electronic part according to claim 1, wherein one of the integration possible electrodes that are part of said group of integration possible electrodes comprises a non-contact electrode which is not connected to said circuit.

4. A back electrode electronic part according to claim 1, wherein one of said integration possible electrodes that are part of said group of integration possible electrodes comprises a signal electrode.

5. A back electrode electronic part according to claim 1, wherein one of said integration possible electrodes that are part of said group of integration possible electrodes comprises a ground potential electrode.

6. A back electrode electronic part according to claim 1, wherein one of said integration possible electrodes that are part of said group of integration possible electrodes comprises a power supply potential electrode.

7. An electronic assembly comprising:
   a back electrode electronic part comprising:
   a main body;
   a circuit; and
   electrodes arranged on an outer back surface of the main body, wherein:
   the electrodes comprise integration possible electrodes and general electrodes;
   a plurality of the integration possible electrodes are arranged adjacently to each other to form a group of integration possible electrodes;
   each of the integration possible electrodes that are part of the group of integration possible electrodes have a substantially same potential level when said circuit operates, said electronic assembly further comprising:
   a printed circuit board; and
   substrate electrodes arranged on an outer surface of the printed circuit board, wherein:
   the substrate electrodes comprising a first substrate electrode and second substrate electrodes;
   said group of integration possible electrodes and said first substrate electrode are connected to a single first solder bump;
   each of said general electrodes and each of said second substrate electrodes are individually connected to single second solder bumps; and
   said first solder bump is larger than each of the second solder bumps.

8. An electronic assembly according to claim 7, wherein said electrodes of said back electrode electronic part are arranged in a matrix, and said group of integration possible electrodes is arranged at a corner of the matrix.

9. An electronic assembly according to claim 7, wherein one of said integration possible electrodes that are part of said group of integration possible electrodes comprises a non-contact electrode which is not connected to said circuit.

10. An electronic assembly according to claim 7, wherein one of said integration possible electrodes that are part of said group of integration possible electrodes comprises a signal electrode.

11. An electronic assembly according to claim 7, wherein one of said integration possible electrodes that are part of said group of integration possible electrodes comprises a ground potential electrode.

12. An electronic assembly part according to claim 7, wherein one of said integration possible electrodes that are part of said group of integration possible electrodes comprises a power supply potential electrode.

13. A back electrode electronic part according to claim 1, wherein said group of integration possible electrodes is directly connected to said first solder bump.

14. A back electrode electronic part according to claim 1, wherein said electrodes arranged on an outer surface of the main body of the back electrode electronic part protrude from said back electrode electronic part so as to support said first and second solder bumps.

15. A back electrode electronic part according to claim 1, wherein the outer surface of the main body is a rearmost surface of said back electrode electronic part.

16. An electronic assembly according to claim 7, wherein said group of integration possible electrodes are directly connected to said first solder bump.

17. An electronic assembly according to claim 7, wherein said electrodes arranged on an outer surface of the main body of the back electrode electronic part protrude from said back electrode electronic part so as to support said first and second solder bumps.

18. An electronic assembly according to claim 7, wherein the outer surface of the main body is a rearmost surface of said back electrode electronic part.

19. A back electrode electronic part comprising:
at least two first electrodes positioned on an outer rear surface of said electronic part and connected to a first solder bump;
at least one second electrode positioned on the outer rear surface of said electronic part and connected to a second solder bump, wherein
said first solder bump has a larger lateral cross section than said second solder bump; and
each of said first electrodes and second electrode are arranged in a matrix on said rear surface of said electronic part so that the first electrodes are spaced apart by the same distance that the second electrode is spaced apart from a nearest one of the first electrodes.

20. A back electrode electronic part comprising:
a main body including a circuit; and
electrodes arranged for solder bumps and supported on an outer back surface portion of said electronic part and connected to said circuit; wherein
said electrodes are arranged into groups of electrodes at portions of the electrode arrangement;
at least one of said groups of electrodes is connected to a first solder bump which is larger than second solder bumps connected to said electrodes arranged other than in said groups of electrodes;
the electrodes arranged other than in said groups of electrodes are each connected to only one second solder bump; and
said groups of electrodes include electrodes having a substantially same potential level when said circuit operates.

21. A back electrode electronic part according to claim 1, wherein each of the electrodes are the same size.

22. A back electrode electronic part according to claim 1, wherein a first distance between a first and a second one of the plurality of integration electrodes forming the group of integration possible electrodes is the same as a second distance between the first one of the plurality of integration electrodes and a nearest one of the general electrodes.

23. A back electrode electronic part according to claim 1, wherein four integration electrodes form the group of integration possible electrodes.

24. A back electrode electronic part according to claim 1, wherein three integration electrodes form the group of integration possible electrodes.

25. A back electrode electronic part according to claim 1, wherein a first and second one of said integration possible electrodes that are part of said group of integration possible electrodes comprises a ground electrode and a non-contact electrode, respectively.

26. A back electrode electronic part according to claim 1, wherein a first and second one of said integration possible electrodes that are part of said group of integration possible electrodes comprises a signal electrode and a non-contact electrode, respectively.

27. A back electrode electronic part according to claim 1, wherein a first and second one of said integration possible electrodes that are part of said group of integration possible electrodes comprises a power electrode and a non-contact electrode, respectively.

28. An electronic assembly according to claim 7, wherein each of the electrodes of the back electrode electronic part are the same size.

29. An electronic assembly according to claim 7, wherein a first distance between a first and a second one of the plurality of integration electrodes of the back electrode electronic part forming the group of integration possible electrodes is the same as a second distance between the first one of the plurality of integration electrodes and a nearest one of the general electrodes.

30. An electronic assembly according to claim 7, wherein four integration electrodes of the back electrode electronic part form the group of integration possible electrodes.

31. An electronic assembly according to claim 7, wherein three integration electrodes of the back electrode electronic part form the group of integration possible electrodes.

32. An electronic assembly according to claim 7, wherein a first and second one of said integration possible electrodes of the back electrode electronic part that are part of said group of integration possible electrodes comprises a ground electrode and a non-contact electrode, respectively.

33. An electronic assembly according to claim 7, wherein a first and second one of said integration possible electrodes of the back electrode electronic part that are part of said group of integration possible electrodes comprises a signal electrode and a noncontact electrode, respectively.

34. An electronic assembly according to claim 7, wherein a first and second one of said integration possible electrodes of the back electrode electronic part that are part of said group of integration possible electrodes comprises a power electrode and a non-contact electrode, respectively.

35. An electronic assembly according to claim 7, wherein said first substrate electrode of said printed circuit board is larger than each of said second electrodes of said printed circuit board.

* * * * *